US007077979B2

(12) United States Patent
Cheetham et al.

(10) Patent No.: US 7,077,979 B2
(45) Date of Patent: Jul. 18, 2006

(54) RED PHOSPHORS FOR SOLID STATE LIGHTING

(75) Inventors: Anthony K. Cheetham, Santa Barbara, CA (US); Neeraj Sharma, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/683,899

(22) Filed: Oct. 10, 2003

(65) Prior Publication Data

US 2005/0077499 A1    Apr. 14, 2005

(51) Int. Cl.
 *C09K 11/69*  (2006.01)
(52) U.S. Cl. .................. 252/301.4 R; 252/301.4 S; 313/503; 257/98
(58) Field of Classification Search ......... 252/301.4 R, 252/301.6 S; 313/503; 257/98
See application file for complete search history.

(56) References Cited

U.S. PATENT DOCUMENTS 3,360,674 A * 12/1967 Mikus et al. ............... 313/468

| 6,084,250 | A  | * | 7/2000 | Justel et al. ................ 257/89 |
| 6,252,254 | B1 | * | 6/2001 | Soules et al. ............... 257/89 |
| 6,278,135 | B1 | * | 8/2001 | Srivastava et al. ........... 257/98 |
| 6,521,915 | B1 |   | 2/2003 | Odaki et al. |
| 6,544,437 | B1 |   | 4/2003 | Park et al. |
| 6,558,574 | B1 |   | 5/2003 | Cwak et al. |

* cited by examiner

*Primary Examiner*—C. Melissa Koslow
(74) *Attorney, Agent, or Firm*—Robert Berliner

(57) ABSTRACT

A red phosphor composition in combination with a semiconductor light emitting device (e.g., VCSEL, LED, or LD), preferably a GaN based device, that emits light at a bright violet-blue light range, i.e., having a wavelength in the range of 400 nm to 600 nm, which can be further combined with green and blue phosphors. The red phosphor composition in the combination is a vanadate combined with yttrium, gadolinium and/or lanthanum and activated with trivalent $Eu^{3+}$, $Sm^{3+}$ and $Pr^{3+}$, or any combination thereof, with or without $Tb^{3+}$ as a co-dopant, has the general formula: $Bi_xLn_{1-x}VO_4$:A where x=0 to 1, Ln is an element selected from the group consisting of Y, La and Gd, and A is an activator selected from $Eu^{3+}$, $Sm^{3+}$ and $Pr^{3+}$, or any combination thereof, with or without $Tb^{3+}$ as a co-dopant. Novel red phosphor compositions are provided when x is greater than 0 and less than 1, preferably 0.05 to 0.5.

19 Claims, 7 Drawing Sheets

RED PHOSPHORS FOR SOLID STATE LIGHTING

FIELD OF THE INVENTION

The invention is in the field of phosphors for solid state lighting.

BACKGROUND OF THE INVENTION

Recently, solid-state lighting based on GaN semiconductors has made remarkable breakthroughs in efficiency. GaN-based diodes emit bright violet-blue light, which can be used to pump longer wavelength phosphors. The first white light emitting diodes (LEDs) became commercially available in 1997. These white LEDs can be obtained by combining a InGaN blue LED emitting at 465 nm with a broad-band yellow phosphor, e.g. $(Y_{1-x}Gd_x)_3(Al_{1-y}Ga_y)_5O_{12}$ (YAG:Ce). The variation of x and y can be used to produce a broad emission from 510 nm and 580 nm, leading to a high color rendering index. These white LEDs have efficiencies comparable to incandescent lights and are proving useful in a wide variety of niche lighting applications.

White light can be produced by a variety of other approaches, including color mixing of three LED emissions (e.g., combining discrete blue, green, and red LEDs) or the pumping of phosphors with a deep blue/UV LED or laser diode (LD). Nitride-based vertical cavity surface emitting lasers (VCSELs), coupled with phosphors optimized for violet or near-UV absorption, offer the greatest potential for high-efficiency solid-state lighting [D. A. Steigerwald, et al]. However, the problem lies in the unavailability of suitable RGB phosphors that are optimized for absorbing the near UV or violet emission from the LEDs or lasers. The red, green and blue phosphors that are currently used in conventional fluorescent lighting have been optimized for excitation by the UV emission from a mercury discharge, for which the characteristic wavelengths are 185 and 254 nm [G. Blasse, et al, 1994]. Hence, the challenge for the new generation of lighting based upon GaN lies in the development of novel families of phosphors that are optimized for excitations at longer wavelengths in the near UV (350–400 nm).

The current phosphor materials of choice for the solid-state lighting initiative are $Y_2O_2S:Eu^{3+}$ for red, $ZnS:(Cu^+, Al^{3+})$ for green, and $BaMgAl_{10}O_{17}:Eu^{2+}$ (BAM) for blue [M. Shinoya, et al]. Unfortunately, the red emission with $Y_2O_2S:Eu^{3+}$ is inadequate in comparison with the green and blue phosphors, both in terms of its efficiency and its stability, so there is an urgent need to make superior red phosphors.

BRIEF SUMMARY OF THE INVENTION

The present invention provides new phosphors absorbing in near UV and emitting in the red by using materials that have broad and intense charge-transfer (C-T) absorption bands in the near UV and are therefore capable of efficiently capturing the emission from a GaN-based LED or LD over a range of wavelengths. Vanadates, combined with selected lanthanides or yttrium, are used, optionally with bismuth, where the oxygen to metal charge-transfer bands are very intense. Following the excitation in the UV, the energy is transferred to an activator ion by a non-radiative mechanism. More particularly, the activator ion is selected from $Eu^{3+}$, $Sm^{3+}$, and $Pr^{3+}$ and any combination thereof, alone or co-doped with $Tb^{3+}$ as an intensifier to enhance transfer. While the red phosphor materials generally should not absorb any of the green or blue emissions, a colored phosphor that converts some of the blue or green to red can have some advantages and are, therefore, not excluded.

More particularly, the invention provides a novel red phosphor composition as well as its combination with a light emitting semiconductor device (e.g., VCSEL, LED, or LD), preferably a GaN based device, that emits light having a wavelength in the range of 200 nm to 620 nm. The composition can contain at least one non-red phosphor in addition to the red phosphor, preferably green and blue phosphors (such as the $ZnS:(Cu^+, Al^{3+})$ and $BaMgAl_{10}O_{17}:Eu^{2+}$ phosphors described above). The red phosphor absorbs the light of a wavelength in the range of 240 nm to 550 nm and emits red light at a wavelength in the range of 580 nm to 700 nm, and is a vanadate combined with yttrium, gadolinium and/or lanthanum and activated with trivalent $Eu^{3+}$, $Sm^{3+}$ and $Pr^{3+}$, or any combination thereof, with or without $Tb^{3+}$ as a co-dopant. When combined with a light emitting semiconductor device, the red phosphor composition of this invention has the general formula:

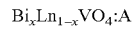

where x=0 to 1, Ln is an element selected from the group consisting of Y, La and Gd, and A is an activator selected from $Eu^{3+}$, $Sm^{3+}$ and $Pr^{3+}$, or any combination thereof, with or without $Tb^{3+}$ as a co-dopant. Novel red phosphor compositions are provided when x is greater than 0 and less than 1, preferably 0.05 to 0.5.

DETAILED DESCRIPTION OF THE INVENTION

Figure 1:
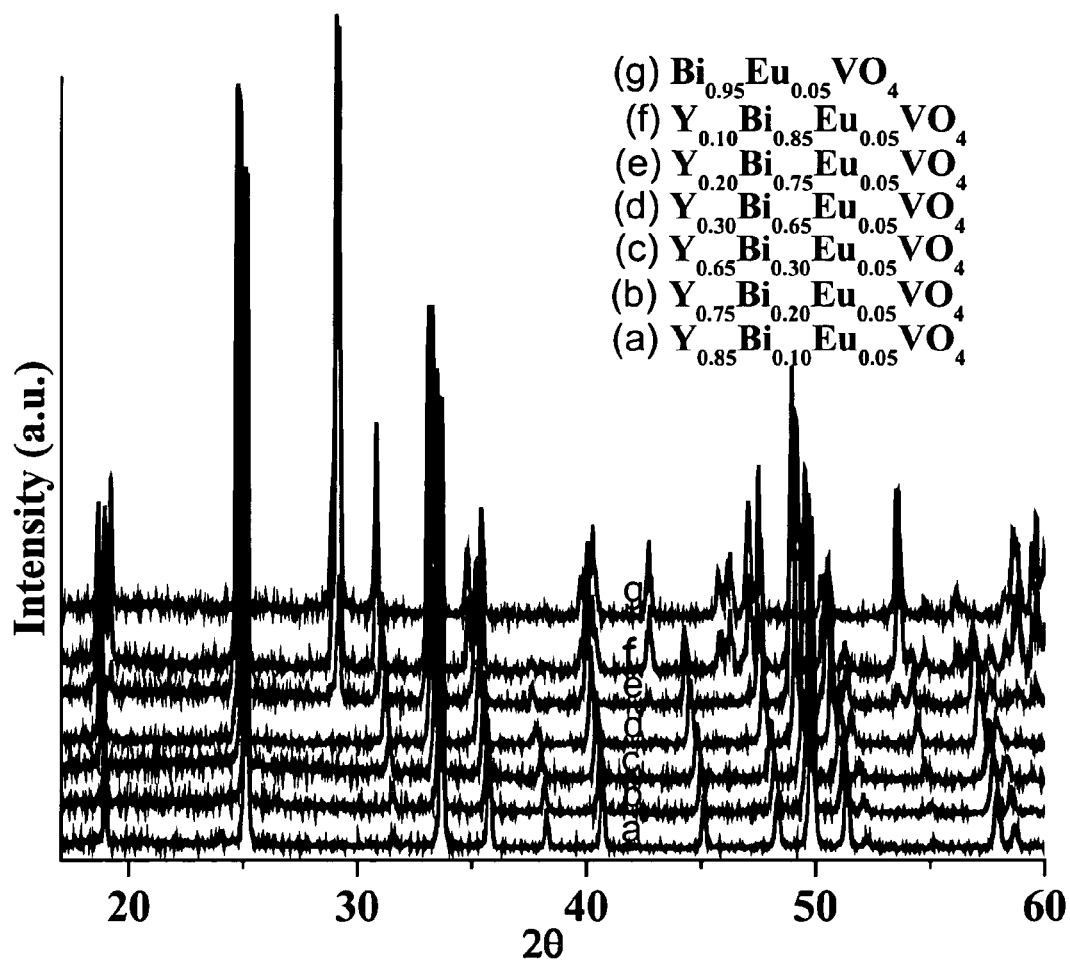
FIG. 1 is a graph showing the powder X-ray diffraction patterns of samples of $Bi_xY_{1-x}VO_4$:Eu.

The light emitting device of the present invention can be any GaN based LED, LD or VCSEL that emits light, preferably monochromatic, at a wavelength in the range of 200 nm to 620 nm. Such devices are well known [M. Shinoya, et al and D. A. Steigerwald, et al], but the red phosphor used in prior devices is inadequate.

In according with the present invention, particularly useful for red phosphors are materials of the general formula:

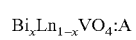

where x is a number equal to or larger than 0 but smaller than 1, Ln is an element selected from the group consisting of Y, La and Gd, and A is an activator selected from $Eu^{3+}$, $Sm^{3+}$ and $Pr^{3+}$, or any combination thereof, with or without $Tb^{3+}$ as a co-dopant. In a preferred embodiment, particularly useful are yttrium vanadates containing $Eu^{3+}$ ($f^6$), which fluoresces via a $^5D_0$ to $^7F_2$ transition at ~612 nm when the ion is present in a non-centrosymmetric site. Eu-doped $YVO_4$, is used as a cathodoluminescent material in color television screens, and is appropriate for the present application, since the C-T band of the vanadate ion is well placed in the UV.

In a preferred embodiment, it is useful to incorporate $Bi^{3+}$ in which $6s^2 \rightarrow 6s6p$ excitations in the bismuth ion can also be used to harvest the near-UV light. In the case of the $Bi_xLn_{1-x}VO_4$ (Ln=Gd, Eu,) system, for example, structural and spectral studies have shown the existence of two ranges of solid solution [Ghamri, et al., 1990; Ghamri, et al., 1989]. One has a tetragonal structure of the zircon type (0<x<0.64) and the other has a monoclinic structure of the scheelite-related fergusonite type (x>0.93). Coordination of the cations in these oxides is such that V is coordinated to four oxygen atoms forming a tetrahedron and Ln (or Bi) to eight oxygen atoms from different tetrahedra. In the present embodiment we have utilized the luminescence behavior of the solid solutions of $Bi_xLn_{1-x}VO_4$:A, where Ln and A are as defined above and 0<x<1, and correlated it with the available structural information. In addition, we have also investigated the effect of co-doping with Tb, e.g., Tb(III)/Pr(III) on the Eu(III) emission in these solid solutions and compare the emission intensities of these samples with the standard red phosphor ($Y_2O_2S:Eu^{3+}$).

The red phosphors of the present invention are excited by light of 240 to 550 nm and emits light of 580 to 700 nm which peaks at ~610 to 650 nm. The $Bi_xLn_{1-x}VO_4$:A composition is obtained by mixing oxides, carbonate and the like of elements which constitute the phosphor at a desired stoichiometric ratio. The red phosphor can be combined with green and blue phosphors, e.g., respectively, ZnS:($Cu^+$, $Al^{3+}$) and $BaMgAl_{10}O_{17}:Eu^{2+}$ phosphors. The combination of phosphors can be applied as a layer to a light emitting semiconductor device such as a VCSEL, LED or LD. For example the combination can be applied as a layer to a GaN die and encapsulated by a lens typically formed of a transparent epoxy. In operation, electrical power is supplied to the GaN die to activate it, which then emits light that activates the phosphors to emit output light of combined wavelengths and which will vary depending on the spectral distribution and intensities of the light emitted from the phosphors. See, for example, the description of the prior art phosphor LED in Lowery, et al. U.S. Pat. No. 6,351,069, the disclosure of which is incorporated herein by reference. The present invention enables the emitted wavelengths to have a combined spectral distribution such that it appears to be "white" light.

In a preferred embodiment, the combination of a red phosphor of this invention and prior art green and blue phosphors are such that the white light is obtained having a combination of spectral ranges of 500 to 580 nm (green), 400 to 500 nm (blue), and 580 to 700 nm (red).

EXAMPLES 1–9

Syntheses of red phosphors in accordance with this invention were carried out by firing well ground samples of rare earth oxide, bismuth oxide and $NH_4VO_3$ in an alumina crucible at 600° C. for 24 h. The products were then removed from the furnace, cooled, finely ground and reheated at 800° C. for another 24–48 h to complete the reaction. In some cases, another round of regrinding was needed. The rare-earth vanadate compounds are white powders (yellow or orange when there is unreacted vanadium oxide), which become yellowish with increasing Bi-content. The dopant atoms were $Eu^{3+}$ (added as $Eu_2O_3$) and $Sm^{3+}$ (added as $Sm_2O_3$) and the doping concentration was about 5 mol % (of the $Ln^{3+}+Bi^{3+}$) in each of the syntheses. The final products were characterized by powder X-ray diffraction, photoluminescence and photoexcitation spectroscopy.

X-ray diffraction studies on $Bi_xLn_{1-x}VO_4$ samples doped with $Eu^{3+}$

Structural studies of the system $Bi_xGd_{1-x}VO_4$ have shown the existence of two ranges of solid solution, as described above [Ghamri, et al., 1990]. The study of the mixed $LnVO_4$—$BiVO_4$ (Ln=Y, Gd, La) samples doped with $Eu^{3+}$ samples shows the expected change in the XRD pattern with increasing bismuth concentration (FIG. 1). Samples with $x \leq 0.65$ show a powder pattern corresponding to the tetragonal zircon phase (FIG. 1a–d), whereas for x>0.65 the powder pattern indicates that these samples contain a mixture of both monoclinic fergusonite and tetragonal zircon phases (FIG. 1e,f). The pure $BiVO_4$ doped with $Eu^{3+}$ shows the powder pattern corresponding to the monoclinic form (FIG. 1g).

Spectral Properties of Bismuth-Rare-Earth Vanadates Doped with $Eu^{3+}$

Figure 2:
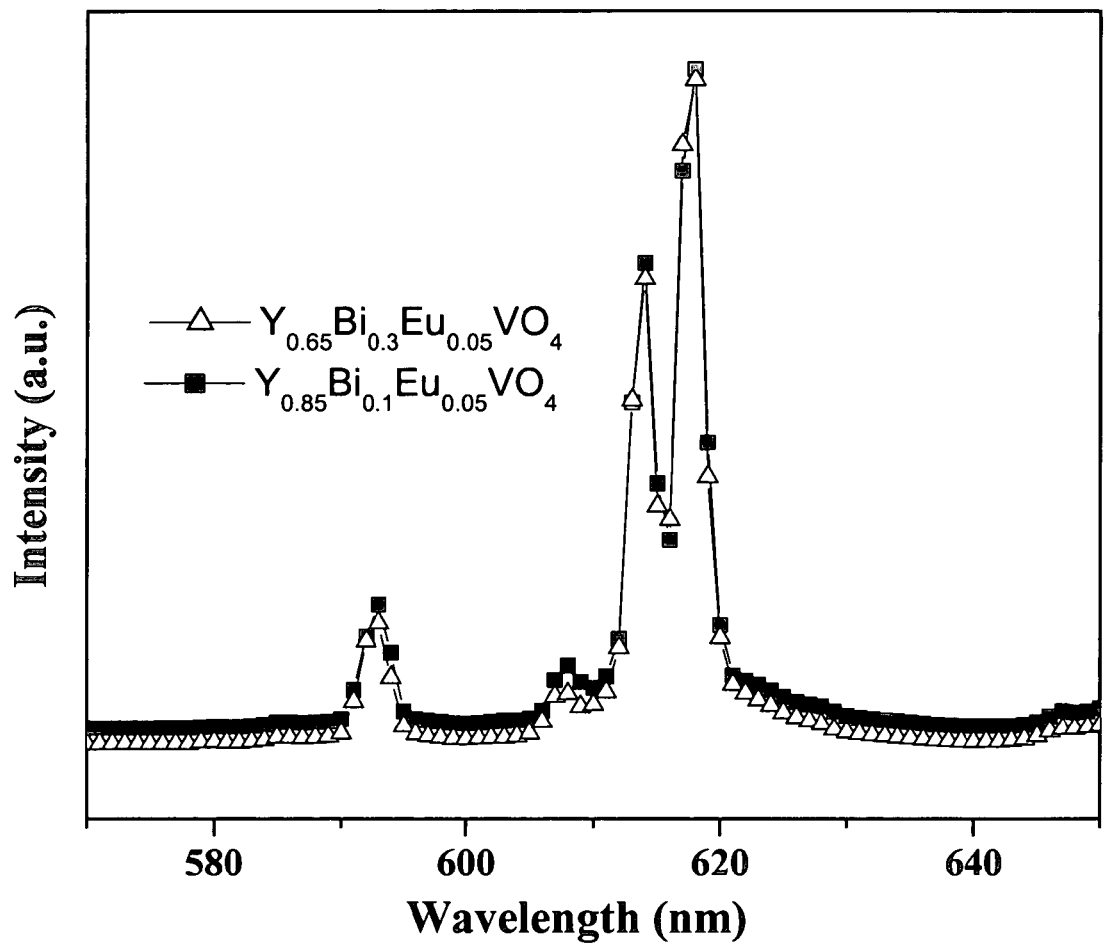
FIG. 2 is a graph showing the photoluminescence spectra of $Bi_xY_{1-x}VO_4$:Eu samples ($\lambda_{exc}$=365 nm)
Figure 3:
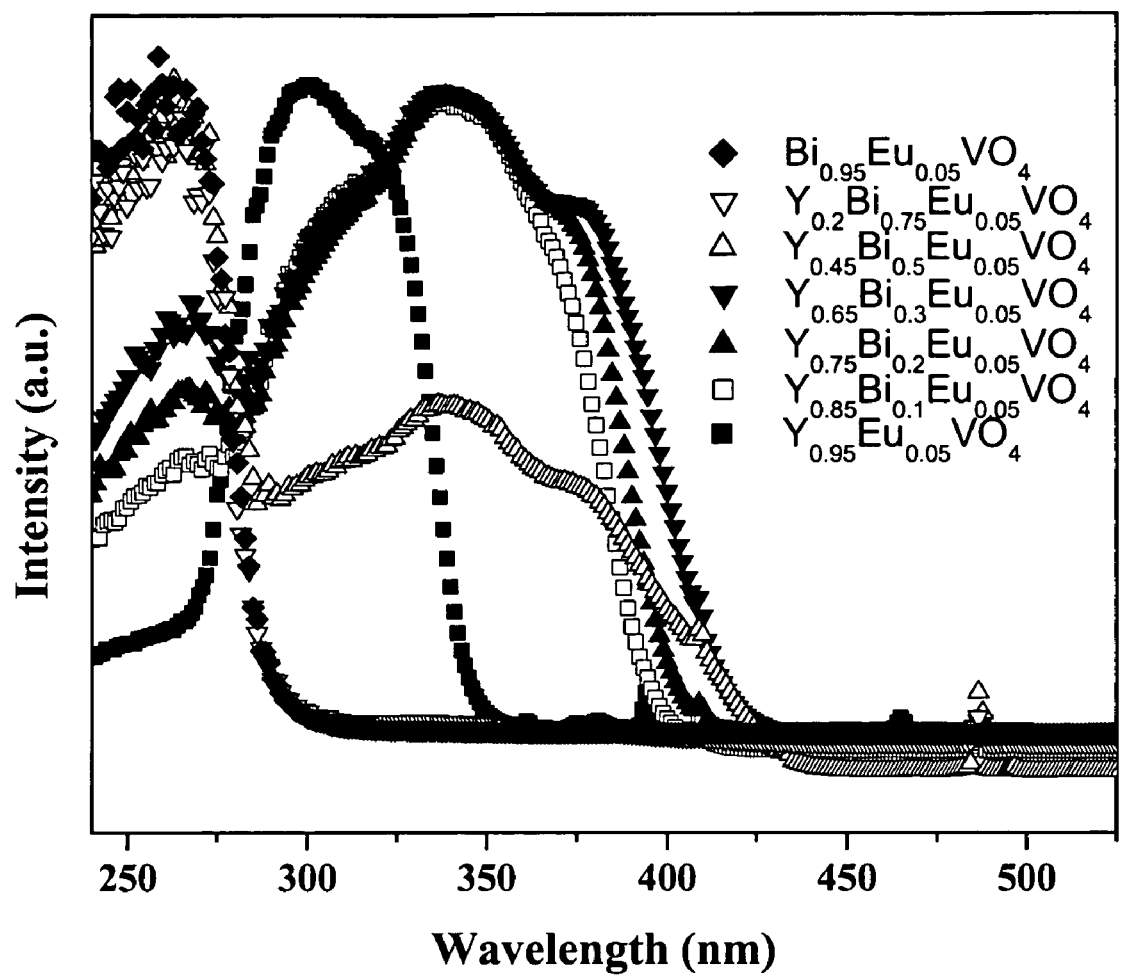
FIG. 3 is a graph showing the excitation spectra of $Bi_xY_{1-x}VO_4$:Eu samples for the 614 nm $Eu^{3+}$ emission.

In general, the photoluminescence spectra of $YVO_4$—$BiVO_4$ doped with $Eu^{3+}$ ions show strong $^5D_0 \rightarrow ^7F_2$ (614, 618 nm) and $^5D_0 ^7F_1$ (593 nm) emission lines on excitation at both 254 nm and 365 nm (FIG. 2). The excitation spectrum for monitoring the $^5D_0 \rightarrow ^7F_2$ emission of $Eu^{3+}$ shows a broad charge-transfer band along with a sharp $^7F_0 \rightarrow ^5L_6$, $Eu^{3+}$ line at 394 nm, the latter being a relatively weak spectral feature when compared to the broad C-T band (FIG. 3). The excitation spectrum in pure $YVO_4$ doped with $Eu^{3+}$ shows a broad absorption maximum centered around ~310 nm, and a band edge at 340 nm, however the absorption in the short-wavelength UV (240–275 nm) is very low. In the case of $Bi_xY_{1-x}VO_4:Eu^{3+}$ the band edge shifts to longer wavelengths with increasing bismuth concentration. For example, the band edge in the excitation spectrum moves from 340 nm (for pure $YVO_4$, x=0) to ~420 nm for the x=0.45 bismuth rich sample (FIG. 3). This increase occurs due to extra absorption involving the Bi—O component in addition to the V—O charge-transfer bands. This increase seems to be monotonic only when less than half (x=0.4–0.45) of the yttrium ions are substituted by $Bi^{3+}$ ions. For substitutions exceeding more than half (x>0.45) of yttrium by $Bi^{3+}$, the long-wavelength charge-transfer band diminishes in intensity and disappears completely for compositions with x>0.65; however, the absorption in the short-wavelength (240–275 nm) appears to increase gradually (FIG. 3).

Figure 4:
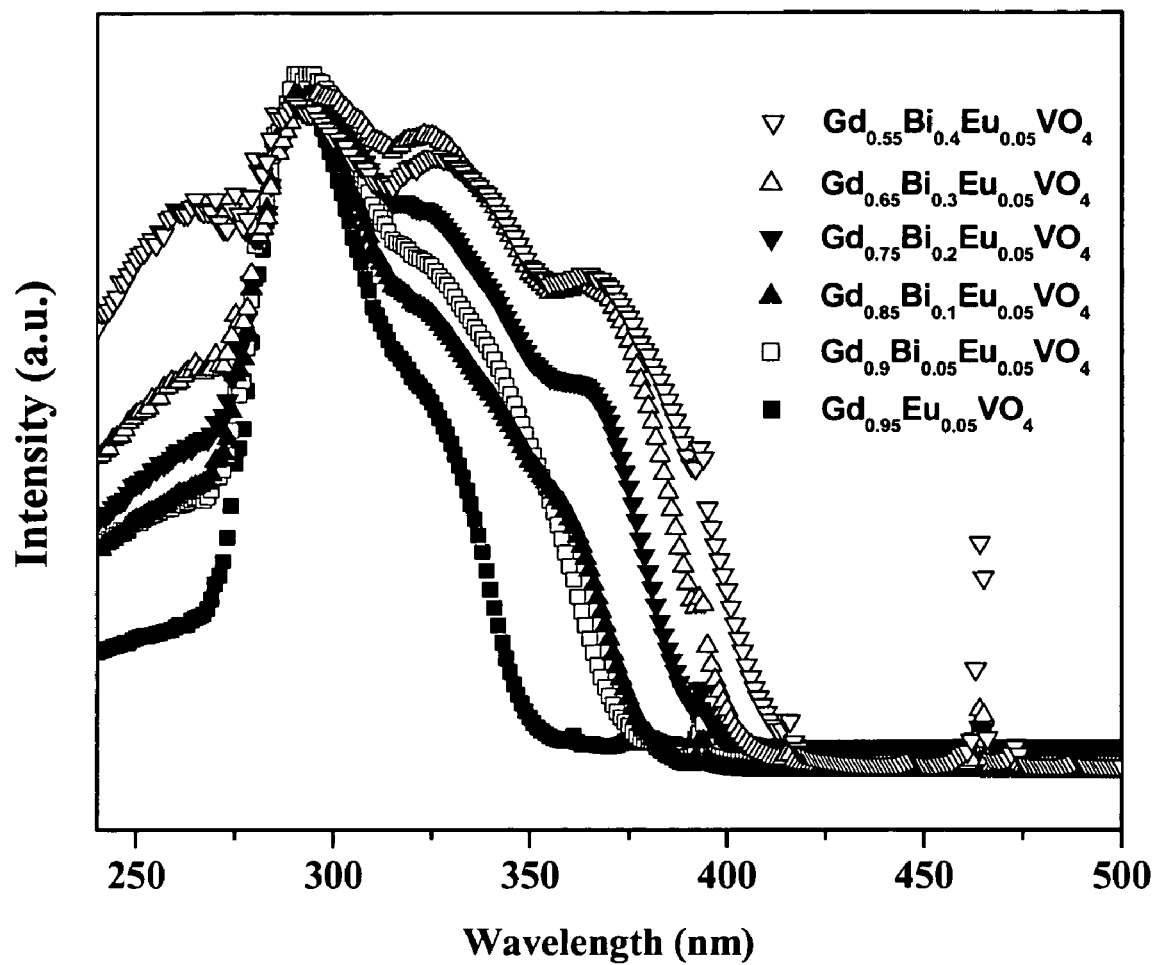
FIG. 4 is a graph showing the excitation spectra of $Bi_xGd_{1-x}VO_4$:Eu samples for the 613 nm $Eu^{3+}$ emission.

The photoluminescence spectra of $GdVO_4$—$BiVO_4$ doped with $Eu^{3+}$ again show the characteristic spectral lines for $Eu^{3+}$ emission. The excitation spectrum for monitoring the $^5D_0 \rightarrow ^7F_2$ emission of $Eu^{3+}$ shows a small absorption in the short-wavelength region (240–275 nm), a broad charge-transfer band at lower energies, and a sharp but weak $^7F_0 \rightarrow {}^5L_6$, $Eu^{3+}$ line at 394 nm (FIG. 4). The excitation spectrum in pure $GdVO_4$ doped with $Eu^{3+}$ shows a band edge at 350 nm, but in the $Bi_xGd_{1-x}VO_4$:$Eu^{3+}$ system the band edge shifts to longer wavelengths with increasing bismuth concentration, moving to ~425 nm for the x=0.4 sample (FIG. 4). Again, this increase seems to be monotonic only when less than half (x=0.4) of the gadolinium ions are substituted by $Bi^{3+}$ ions. For substitutions exceeding x=0.4, the long-wavelength charge-transfer band again decreases in intensity, as in the yttrium system, though the short-wavelength (240–275 nm) absorption increases gradually.

Figure 5:
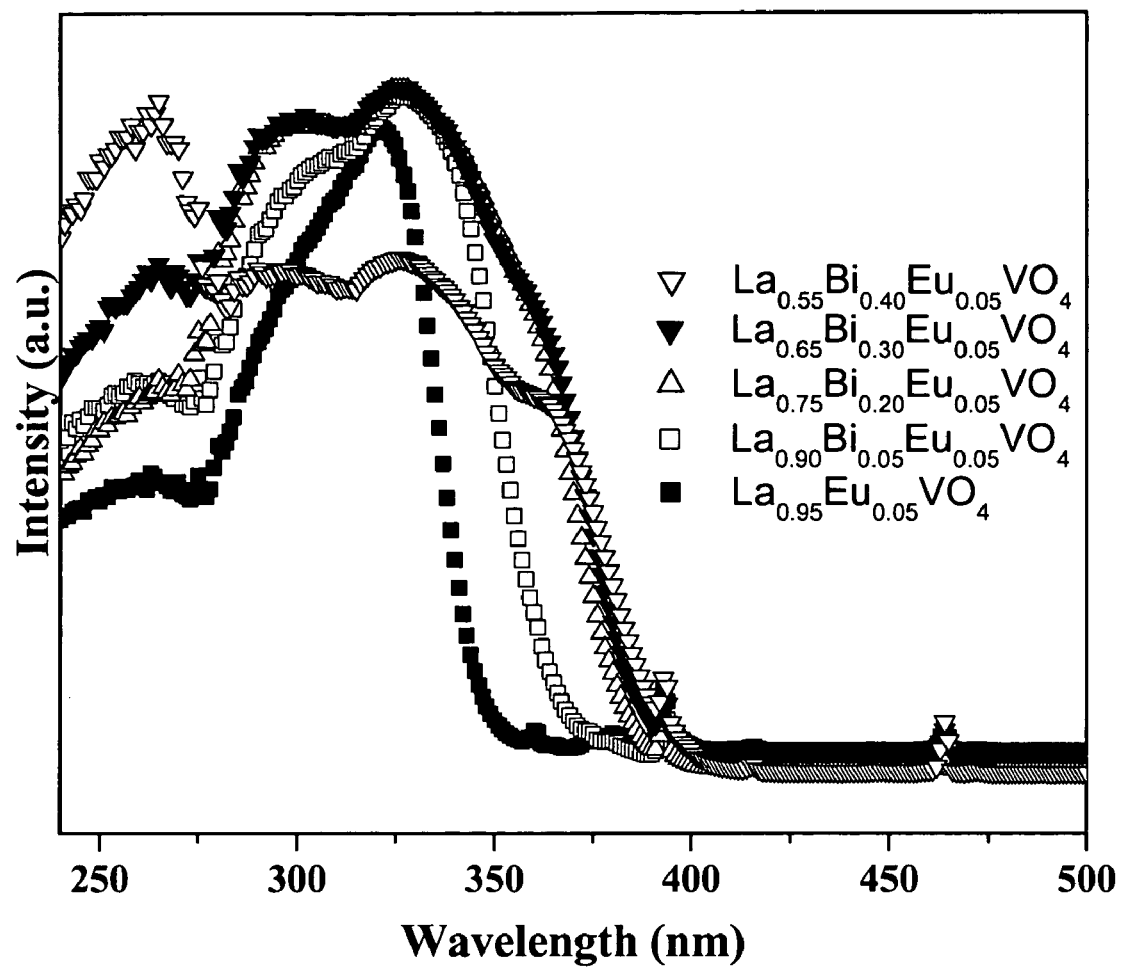
FIG. 5 is a graph showing the excitation spectra of $Bi_xLa_{1-x}VO_4$:Eu samples for the 612 nm $Eu^{3+}$ emission.

The photoluminescence spectra of $LaVO_4$—$BiVO_4$ doped with $Eu^{3+}$ also show similar trends in luminescence properties with increasing bismuth content to those observed for yttrium-bismuth/gadolinium-bismuth vanadates (FIG. 5).

Figure 6:
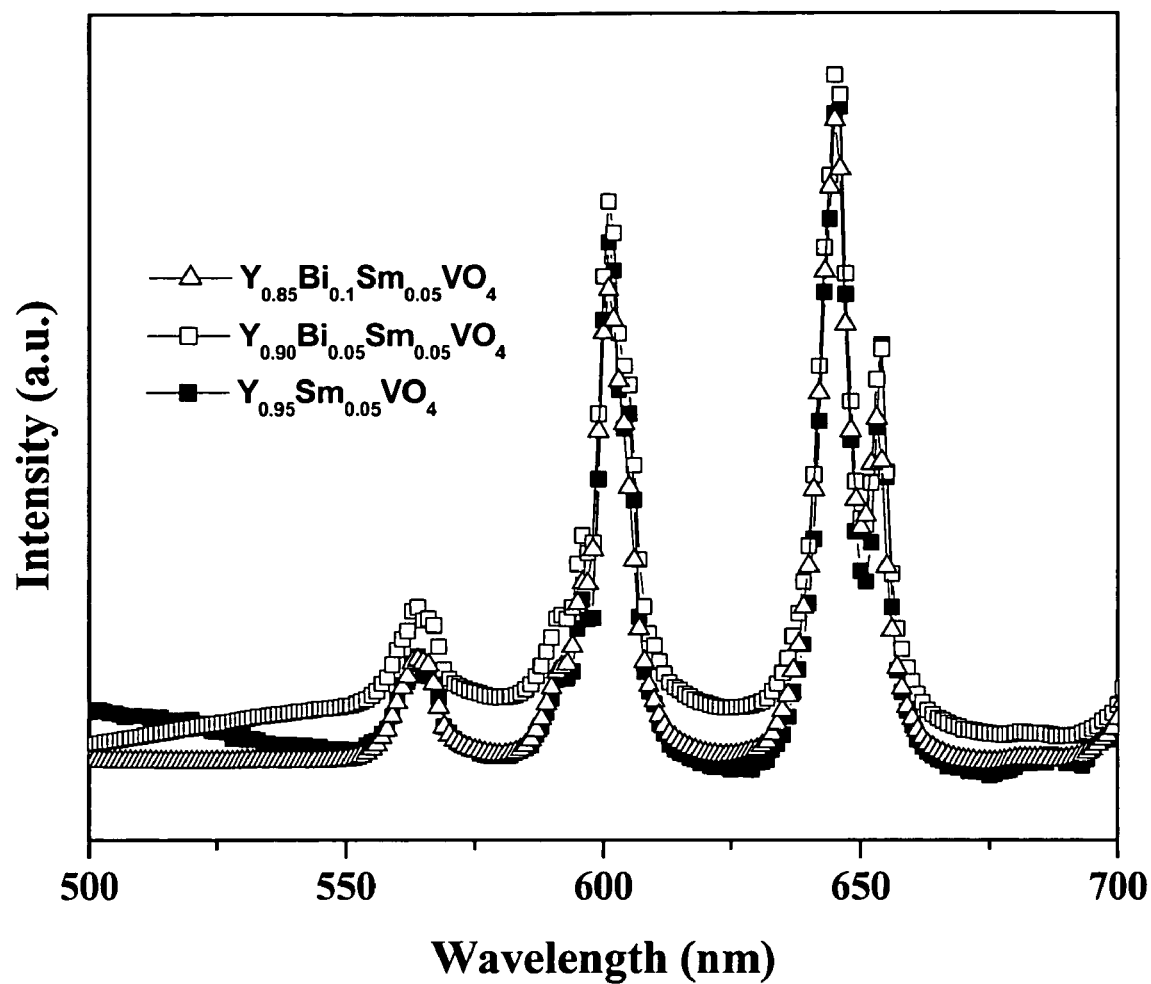
FIG. 6 is a graph showing the photoluminescence spectra of $Bi_xY_{1-x}VO_4$:Sm samples ($\lambda_{exc}$=363.8 nm)
Figure 7:
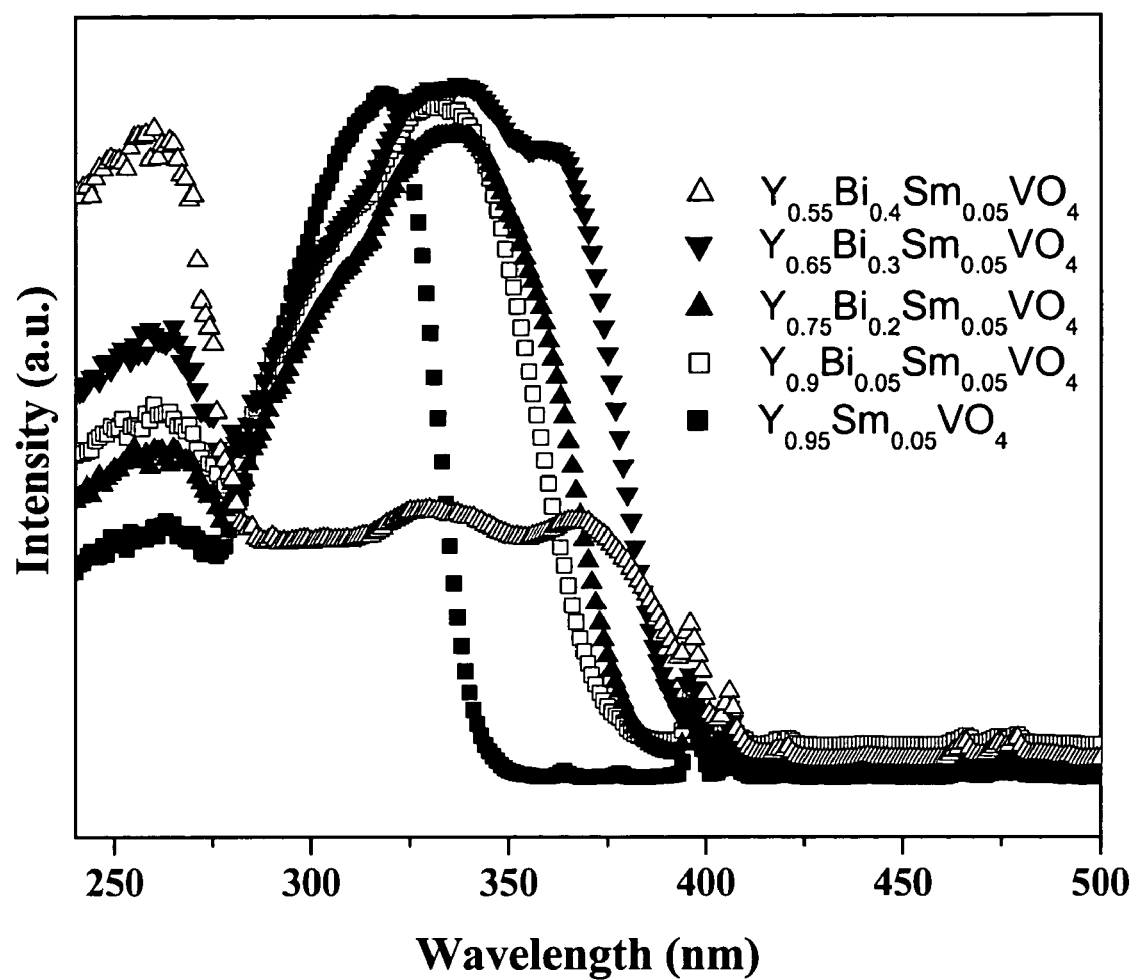
FIG. 7 is a graph showing the excitation spectra of $Bi_xY_{1-x}VO_4$:Sm samples for the 645 nm $Sm^{3+}$ emission.

Spectral Properties of Bismuth-Yttrium Vanadates Doped with $Sm^{3+}$ $Sm^{+3}$ as an activator in $YVO_4$ is known to have high emission efficiency. There is also considerable similarity in the emission colors of both $Sm^{3+}$ (orange red) and $Eu^{3+}$ (red) in the vanadate lattice. The photoluminescence spectra $YVO_4$—$BiVO_4$ doped with $Sm^{3+}$ ions show the main emission lines for $Sm^{+3}$ are 564 ($^4G_{5/2}$-$^6H_{5/2}$), 601 ($^4G_{5/2}$-$^6H_{7/2}$) and 645, 654 nm ($^4G_{5/2}$-$^6H_{9/2}$) on excitation at 363.8 nm (FIG. 6). The excitation spectrum for monitoring the $^4G_{5/2} \rightarrow {}^6H_{9/2}$ emission of $Sm^{3+}$ shows a weak absorption band at short wavelengths (240–275 nm), a broad charge-transfer band centered around ~320 nm, plus the sharp $Sm^{3+}$ lines (FIG. 7). The excitation spectrum in pure $YVO_4$ doped with $Sm^{3+}$ shows a broad maximum centered around ~320 nm with a band edge at 350 nm. In the case of $Y_{1-x}Bi_xVO_4$:$Sm^{3+}$ samples the charge-transfer band and the band edge shift to longer wavelengths with increasing bismuth concentration. As the bismuth concentration increases the band edge in the excitation spectrum moves from 340 nm (for pure $YVO_4$x=0) to ~415 nm for (x=0.4) bismuth rich samples. As with the other systems described above, this increase seems to be monotonic only when less than half (x=0.4) of the yttrium ions are substituted by $Bi^{3+}$ ions. For substitutions exceeding x>0.45 of yttrium by $Bi^{3+}$ ions the long-wavelength charge-transfer band decreases drastically in intensity, whereas the absorption at short wavelengths (240–275 nm) increases gradually (FIG. 7).

In Table 1, we list the comparison of emission intensities of the $Bi_xY_{1-x}VO_4$:$Eu^{3+}$ ions to that of the standard $Y_2O_2S$:$Eu^{3+}$ red phosphor on excitation at 400 nm. The samples containing low concentrations of $Bi^{3+}$ show a decreased $Eu^{3+}$ emission when compared to that of the standard red phosphor when excited at 400 nm, whereas the samples containing bismuth x≧0.2 show a much enhanced emission, the highest being in sample containing bismuth x=0.3. The increase in the emission intensity of $Eu^{3+}$ with $Bi^{3+}$ content is due the energy transfer from $Bi^{3+}$ center to $Eu^{3+}$. Increased bismuth content decreases the efficiency of this energy transport from the matrix to $Eu^{3+}$, perhaps by distorting the former. Such distortions may arise from the chemical and electronic nature of $Y^{3+}$ and $Bi^{3+}$ ions.

TABLE 1

Comparison of emission intensities of the $Y_{1-x}Bi_xVO_4$:$Eu^{3+}$ ions to that of the standard $Y_2O_2S$:$Eu^{3+}$ red phosphor

| Example | Composition | Emission Intensity ($\lambda_{exc}$ = 400 nm) |
|---|---|---|
|  | $Y_2O_2S$:Eu (standard) | 3.3 |
| 1 | $Y_{0.95}Eu_{0.05}VO_4$ | 0.13 |
| 2 | $Y_{0.90}Bi_{0.05}Eu_{0.05}VO_4$ | 0.15 |
| 3 | $Y_{0.85}Bi_{0.10}Eu_{0.05}VO_4$ | 0.12 |
| 4 | $Y_{0.75}Bi_{0.20}Eu_{0.05}VO_4$ | 0.72 |
| 5 | $Y_{0.70}Bi_{0.25}Eu_{0.05}VO_4$ | 0.77 |
| 6 | $Y_{0.65}Bi_{0.30}Eu_{0.05}VO_4$ | 1.2 |
| 7 | $Y_{0.60}Bi_{0.35}Eu_{0.05}VO_4$ | 0.81 |
| 8 | $Y_{0.55}Bi_{0.40}Eu_{0.05}VO_4$ | 0.97 |
| 9 | $Y_{0.50}Bi_{0.45}Eu_{0.05}VO_4$ | 0.71 |

The $Bi_xY_{1-x}VO_4$ samples codoped with $Eu^{3+}$,$Tb^{3+}$ or $Eu^{3+}$, $Pr^{3+}$ ions also show a similar comparison to the standard red phosphor when their emission intensities were measured at 400 nm. No energy transfer from the $Tb^{3+}$ or $Pr^{3+}$ was observed as expected in the beginning, though the reasons to this effect are still unclear. Further study in this regard is under progress.

Datta, et al. showed that for the $YVO_4$:Eu, Bi system, increasing amount of $Bi^{3+}$ ions in the lattice, the excitation bands shift to longer wavelengths. The $6s^2 \rightarrow 6s6p$ transition of $Bi^{3+}$ ions often contributes to the luminescence of bismuth-doped phosphors [Blasse, et al. 1968]. We believe that the extra absorption and the band shift towards longer wavelengths in the excitation spectrum of $LnVO_4$—$BiVO_4$ samples doped with $Eu^{3+}$ or $Sm^{3+}$ involves the absorption due to $Bi^{3+}$ ions. Such extra absorption has also been witnessed in other cases when $ns^2$ ions have been introduced in other host lattices absorbing in the UV region, for example, $CaWO_4$—$PbWO_4$ [Blasse, et al. 1994], $Y_2WO_6$—Bi [Blasse, et al. 1968]. The more puzzling observation however, is that the excitation spectra of the $Bi_{1-x}Ln_xVO_4$ samples doped with $Eu^{3+}$ or $Sm^{3+}$ show a decrease in the long wavelength absorption above a critical bismuth concentration. Literature reports on bismuth, antimony niobates and tantalates have concluded that if $ns^2$ ions are in a more favorable asymmetrical coordination, the outer electrons ($ns^2$) tend to be more localized and stabilized, so their influence on the luminescence of the surrounding centers is smaller [Wiegel, et al.]. The excitation spectra of the samples with low bismuth content (x≦0.4) can be explained by the fact that $Bi^{3+}$ ions are present in a more symmetrical (zircon-type) environment, and hence the $6S^2$ electrons are on top of the 2p level of $O_{2-}$ as a result of which the excitation band shifts to longer wavelengths. Beyond a certain limit increasing bismuth content (0.4<x<0.64), we observe a drastic reduction in the long-wavelength absorption in the excitation spectra, even though the samples are still with in the composition regime of the zircon phase (0<x<0.64). The luminescence behavior of the $Bi_{1-x}Ln_xVO_4$:Eu/Sm samples with 0.4<x<0.64 must stem from distortion of the bismuth environments as more Bi is introduced into the zircon structure.

EXAMPLES 10–19

Syntheses of other red phosphors having the general formula: $Bi_xLn_{1-x}VO_4$:A, where x=0 to 1, Ln is an element selected from the group consisting of Y, La and Gd, and A is an activator selected from $Eu^{3+}$, $Sm^{3+}$ and $Pr^{3+}$, combination thereof, with or without $Tb^{3+}$ as a co-dopant can be synthesized using the procedure of Examples 1–9. Thus, well ground samples of rare earth oxide, bismuth oxide and $NH_4VO_3$ can be fired in an alumina crucible at 600° C. for 24 h. The products can then be removed from the furnace, cooled, finely ground and reheated at 800° C. for another 24–48 h to complete the reaction, with another round of regrinding if needed. Dopant atoms of $Eu^{3+}$ (as $Eu_2O_3$), $Sm^{3+}$ (as $Sm_2O_3$), and/or $Pr^{3+}$ ($Pr_2O_3$) can be added at a doping concentration of about 5 mol % (of the $Ln^{3+}+Bi^{3+}$) in each of the syntheses. To some of the compositions ~25 to 40 ppm of $Tb^{3+}$ can be added. The final red phosphors, which will have formulas shown in Table 2, can be characterized by powder X-ray diffraction, photoluminescence and photoexcitation spectroscopy.

TABLE 2

Compositions of Examples 10–19

| Example | Composition |
| --- | --- |
| 10 | $Y_{0.95}Sm_{0.05}VO_4$ |
| 11 | $Y_{0.95}Pr_{0.05}VO_4$ |
| 12 | $Y_{0.90}Bi_{0.05}Sm_{0.05}VO_4$ |
| 13 | $Y_{0.85}Bi_{0.10}Pr_{0.05}VO_4$ |
| 14 | $Y_{0.75}Bi_{0.20}Eu_{0.03}Sm_{0.02}VO_4$ |
| 15 | $Y_{0.70}Bi_{0.25}Eu_{0.02}Pr_{0.03}VO_4$ |
| 16 | $Y_{0.65}Bi_{0.30}Eu_{0.04999}Tb_{0.00001}VO_4$ |
| 17 | $Y_{0.60}Bi_{0.35}Eu_{0.025}Pr_{0.02499}Tb_{0.00001}VO_4$ |
| 18 | $Y_{0.55}Bi_{0.40}Eu_{0.025}Sm_{0.02499}Tb_{0.00001}VO_4$ |
| 19 | $Y_{0.50}Bi_{0.45}Eu_{0.025}Sm_{0.01}Pr_{0.01499}Tb_{0.00001}VO_4$ |

REFERENCES

Blasse, G. and A. Bril, J. Chem. Phys. 1968 48(1) 217.
Blasse, G., and B. C. Grabmeier, Luminescent Materials, (Springer-Verlag, Berlin, 1994).
Datta, R. K., J. Electrochem. Soc. 1967, 114(10) 1057.
Ghamri, J., H. Baussart, M. Lebras and J. M. Leroy, J. Phys. Chem. Solids, 1989, 50, 1237.
Ghamri, J., H. Baussart, M. Lebras and J. M. Leroy, Ann. Chim-Sci Mat. 1990 15(3) 111.
Shinoya, M., and W. M. Yen, Phosphor HandBook, (CRC Press, 1999)
Steigerwald, D. A., J. C. Bhat, D. Collins, R. M. Fletcher, M. O. Holcomb, M. J. Ludowise, P. S. Martin and S. L. Rudaz, IEEE. J. Sel. Top. Quant. 2002, 8(2) 310.
Wiegel, M., W. Middel and G. Blasse, J. Mater. Chem. 1995, 5(7) 981.

The invention claimed is:

1. A light emitting semiconductor device, comprising:
a GaN based light emitting diode that emits light having a wavelength in the range of 200 nm to 620 nm;
a red phosphor that absorbs light of a wavelength in the range of 240 nm to 550 nm and emits red light at a wavelength in the range of 580 nm to 700 nm, having the formula:

$Bi_xLn_{1-x}VO_4$:A where x is 0.05 to 0.5, Ln is an element selected from the group consisting of Y, La and Gd, and A is an activator selected from $Eu^{3+}$, $Sm^{3+}$ and $Pr^{3+}$, or any combination thereof, with or without $Tb^{3+}$ as a co-dopant;
a green phosphor; and
a blue phosphor.

2. The device of claim 1 including $Tb^{3+}$ as a co-dopant.

3. The device of claim 1 in which said green phosphor is $ZnS:(Cu^+,Al^{3+})$ and said blue phosphor is $BaMgAl_{10}O_{17}:Eu^{2+}$.

4. A white light emitting phosphor combination, comprising:
a red phosphor having the formula:

$Bi_xLn_{1-x}VO_4$:A where x is greater than 0 and less than 1, Ln is an element selected from the group consisting of Y, La and Gd, and A is an activator selected from $Eu^{3+}$, $Sm^{3+}$, or $Pr^{3+}$, or any combination thereof, with or without $Tb^{3+}$ as a co-dopant;
a green phosphor; and
a blue phosphor.

5. The phosphor combination of claim 4 in which said red phosphor absorbs light of a wavelength in the range of 240 nm to 550 nm and emits red light at a wavelength in the range of 580 nm to 700 nm.

6. The phosphor combination of claim 4 in which said green phosphor is $ZnS:(Cu^+,Al^{3+})$ and said blue phosphor is $BaMgAl_{10}O_{17}:Eu^{2+}$ suitable for use in a GaN based device.

7. A white light emitting phosphor combination,
a red phosphor that absorbs said light of a wavelength in the range of 240 nm to 550 nm and emits red light at a wavelength in the range of 580 nm to 700 nm, having the formula:

$Bi_xLn_{1-x}VO_4$:A where x is 0.05 to 0.5, Ln is an element selected from the group consisting of Y, La and Gd, and A is an activator selected from $Eu^{3+}$, $Sm^{3+}$ and $Pr^{3+}$, or any combination thereof, with or without $Tb^{3+}$ as a co-dopant.;
a green phosphor comprising $ZnS:(Cu^+,Al^{3+})$; and
a blue phosphor comprising $BaMgAl_{10}O_{17}:Eu^{2+}$.

8. The phosphor combination of claim 7 in which said red phosphor includes $Tb^{3+}$ as a co-dopant.

9. A red phosphor that absorbs said light of a wavelength in the range of 240 nm to 550 nm and emits red light at a wavelength in the range of 580 nm to 700 nm , having the formula:

$Bi_xLn_{1-x}VO_4$:A where x is 0.05 to 0.5, Ln is an element selected from the group consisting of Y, La and Gd, and A is an activator selected from $Eu^{3+}$, $Sm^{3+}$ and $Pr^{3+}$, or any combination thereof, with or without $Tb^{3+}$ as a co-dopant.

10. The phosphor of claim 9 in which in which said red phosphor includes $Tb^{3+}$ as a co-dopant.

11. A light emitting device, comprising:
a semiconductor device that emits light having a wavelength in the range of 200 nm to 620 nm ; and
a red phosphor having the formula:

$Bi_xLn_{1-x}VO_4$:A where x is 0.05 to 0.5, Ln is an element selected from the group consisting of Y, La and Gd, and A is an activator selected from $Eu^{3+}$, $Sm^{3+}$ and $Pr^{3+}$, or any combination thereof, with or without $Tb^{3+}$ as a co-dopant.

12. The device of claim 11 in which the semiconductor device is a GaN based device.

13. The device of claim 12 in which the semiconductor device is a light emitting diode.

14. A light emitting device, comprising:
a semiconductor device that emits light having a wavelength in the range of 200 nm to 620 nm; and
a red phosphor comprising a vanadate combined with yttrium, gadolinium and/or lanthanum and activated with trivalent $Eu^{3+}$, $Sm^{3+}$ or $Pr^{3+}$, or any combination thereof, with $Tb^{3+}$ as a co-dopant.

15. A white light emitting phosphor combination, comprising:
a red phosphor comprising a vanadate combined with yttrium, gadolinium and/or lanthanum and activated with trivalent $Eu^{3+}$, $Sm^{3+}$ and $Pr^{3+}$, or any combination thereof, with $Tb^{3+}$ as a co-dopant;
a green phosphor; and
a blue phosphor.

16. A red phosphor that absorbs said light of a wavelength in the range of 240 nm to 550 nm and emits red light at a wavelength in the range of 580 nm to 700 nm, having the formula:

$$Bi_xLn_{1-x}VO_4:A$$

where x is greater than 0 and less than 1, Ln is an element selected from the group consisting of Y, La and Gd, and A is an activator selected from $Eu^{3+}$, $Sm^{3+}$ and $Pr^{3+}$, or any combination thereof, with $Tb^{3+}$ as a co-dopant.

17. The phosphor of claim 16 in which x is 0.05 to 0.5.

18. A light emitting GaN based device, comprising:
a semiconductor device that emits light having a wavelength in the range of 200 nm to 620 nm;
a green phosphor and a blue phosphor; and
a red phosphor having the formula:

$$Bi_xLn_{1-x}VO_4:A$$

where x is greater than 0 and less than 1, Ln is an element selected from the group consisting of Y, La and Gd, and A is an activator selected from $Eu^{3+}$, $Sm^{3+}$ and $Pr^{3+}$, or any combination thereof, with or without $Tb^{3+}$ as a co-dopant.

19. A light emitting GaN based device, comprising:
a semiconductor device that emits light having a wavelength in the range of 200 nm to 620 nm;
a red phosphor having the formula:

$$Bi_xLn_{1-x}VO_4:A$$

where x is greater than 0 and less than 1, Ln is an element selected from the group consisting of Y, La and Gd, and A is an activator selected from $Eu^{3+}$, $Sm^{3+}$ and $Pr^{3+}$, or any combination thereof with or without $Tb^{3+}$ as a co-dopant;
a green phosphor having the formula: $ZnS:(Cu^+,Al^{3+})$; and
a blue phosphor having the formula: $BaMgAl_{10}O_{17}:Eu^{2+}$.

* * * * *